United States Patent
Considine et al.

(10) Patent No.: US 7,965,100 B1
(45) Date of Patent: Jun. 21, 2011

(54) TRANSMITTER WITH INTERNAL COMPENSATION FOR VARIANCE IN DIFFERENTIAL DATA LINE IMPEDANCE

(75) Inventors: Peter Considine, Peymeinade (FR); Olivier Depuits, Magagnosc (FR); Jagdish Chand Goyal, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 12/683,872

(22) Filed: Jan. 7, 2010

(51) Int. Cl.
*H03K 17/16* (2006.01)
*H03K 19/003* (2006.01)

(52) U.S. Cl. .................. 326/30; 326/32; 326/86

(58) Field of Classification Search .......... None
See application file for complete search history.

(56) References Cited

U.S. PATENT DOCUMENTS

| | | | |
|---|---|---|---|
| 6,504,397 B1 * | 1/2003 | Hart et al. .......... | 326/30 |
| 7,102,381 B2 * | 9/2006 | Chen et al. ........ | 326/30 |
| 7,590,392 B2 * | 9/2009 | Navaratnam et al. ...... | 455/103 |
| 2003/0067325 A1 * | 4/2003 | Haycock et al. ......... | 326/82 |

* cited by examiner

*Primary Examiner* — Anh Q Tran
(74) *Attorney, Agent, or Firm* — John J. Patti; Wade J. Brady, III; Frederick J. Telecky, Jr (57) ABSTRACT

In at least some embodiments, an electronic device includes a first data endpoint and differential data transceiver coupled to the first data endpoint. The differential transceiver provides a communication interface between the first data endpoint and a second data endpoint. The differential transceiver compensates for variations in a series impedance and/or a parallel impedance for a differential data line between the differential transceiver and the second data endpoint.

20 Claims, 4 Drawing Sheets

TRANSMITTER WITH INTERNAL COMPENSATION FOR VARIANCE IN DIFFERENTIAL DATA LINE IMPEDANCE

CROSS-REFERENCE TO RELATED APPLICATIONS

This application is a non-provisional application claiming priority to European Patent Application Serial No. EP 09290881.3, filed on Nov. 25, 2009, and entitled "Transmitter With Internal Compensation For Variance In Differential Data Line Series Impedance", the teachings of which are incorporated by reference herein.

BACKGROUND

In order for high-speed differential data communications to be successful, predetermined communication parameters need to be met. For example, the transmitter output impedance, the data line characteristic impedance, and the receiver input impedance should be matched to limit data reflections.

SUMMARY

In at least some embodiments, an electronic device comprises a first data endpoint and differential data transceiver coupled to the first data endpoint. The differential data transceiver providing a communication interface between the first data endpoint and a second data endpoint. The differential transceiver internally compensates for variations in a series impedance for a differential data line between the differential transceiver and the second data endpoint.

In at least some embodiments, a differential data transmitter comprises a differential data line port and programmable circuitry coupled to the differential data line port. The programmable circuitry internally compensates for external variances in a differential data line series impedance.

In at least some embodiments, a method is performed for a differential data transmitter. The method comprises detecting a variance in a differential data line series impedance and programming the differential data transmitter to internally compensate for the variance.

BRIEF DESCRIPTION OF THE DRAWINGS

For a detailed description of various embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document doe not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. The term "system" refers to a collection of two or more hardware and/or software components, and may be used to refer to an electronic device or devices or a sub-system thereof.

DETAILED DESCRIPTION

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

Embodiments of the invention are directed to differential data transmitters and related systems and methods. In at least some embodiments, a differential data transmitter internally compensates for external variations in the series impedance of a differential data line coupled thereto. In this manner, predetermined requirements for differential data communications can be met while maintaining flexibility with external device components or circuitry that are desired or inherent for different product designs, but that affect the series impedance of the differential data line.

Figure 1:
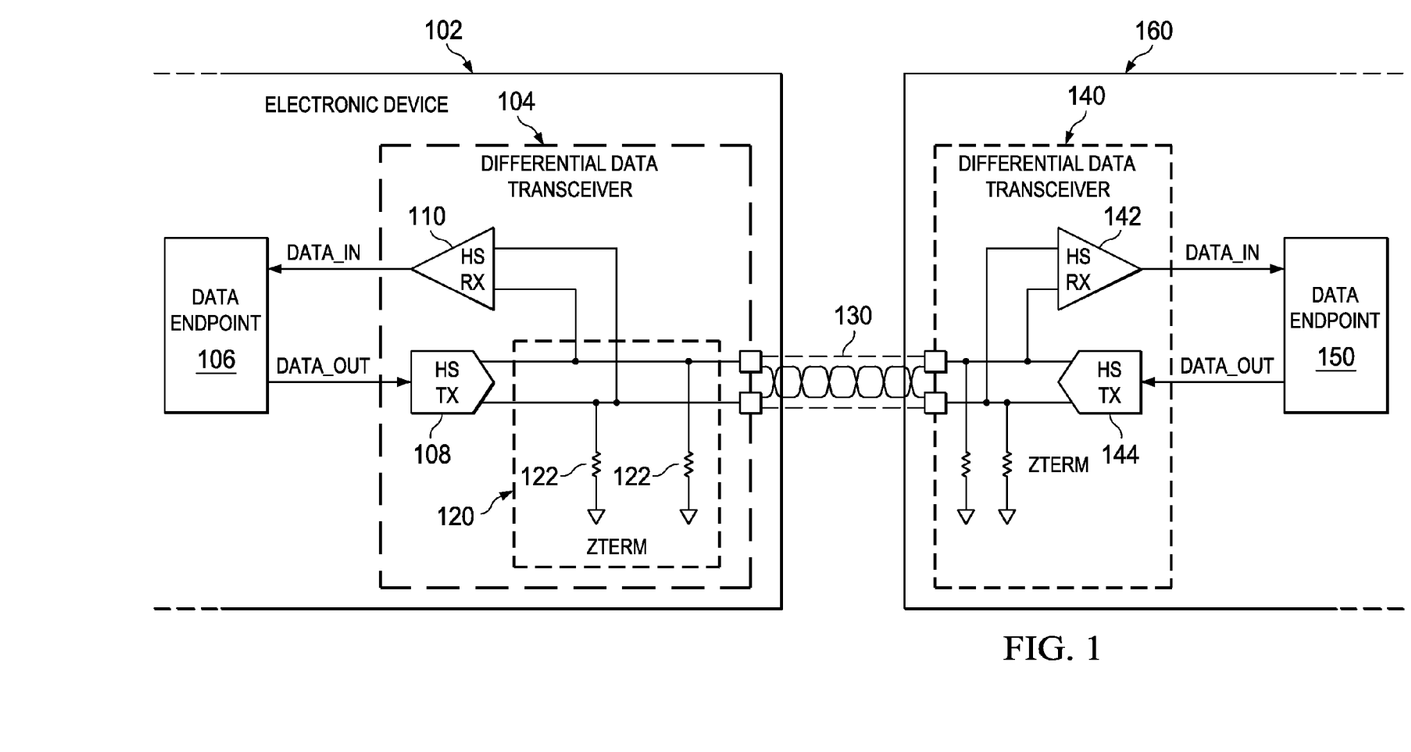
FIG. 1 shows a system in accordance with an embodiment of the disclosure.

FIG. 1 shows a system 100 in accordance with an embodiment of the disclosure. As shown, the system 100 comprises a first electronic device 102 and a second electronic device 160 configured to communicate via a differential data line 130. More specifically, the first electronic device 102 comprises a differential data transceiver 104 coupled to a data endpoint 106. Similarly, the second electronic device 160 comprises a differential data transceiver 140 coupled to a data endpoint 150. Each of the data endpoints 106, 150 corresponds to an addressable component that is the source or sink of information transmitted between the first and second electronic devices 102, 160. As an example, each of the electronic devices 102, 160 may be a host device or a peripheral device compatible with the Universal Serial Bus (USB) 2.0 protocol or another differential data communication protocol.

As shown, the differential data transceiver 104 comprises a high-speed receiver 110 and a high-speed transmitter 108 coupled between the data endpoint 106 and the differential data line 130. In operation, the high-speed transmitter 108 receives data from the data endpoint 106 and controls the voltage levels on the differential data line 130 to transmit a representation of this data over the different data line 130. Meanwhile, the high-speed receiver 110 is configured to examine the voltage levels on the different data line 130 and to decode data accordingly. The decoded data is then forwarded to the data endpoint 106. If the first electronic device 102 has multiple data endpoints, as may be the case in some embodiments, the high-speed receiver 110 is be to forward the data to the correct data endpoint based on an addressing scheme. The operation of the differential data transceiver 140 and its components (e.g., the high-speed transmitter 144 and the high-speed receiver 142) can be understood to be similar to the operation of the differential data transceiver 104 and its components. However, at least one of the differential data transceivers 104, 160 comprises programmable circuitry that enables compensation for external variations in the series impedance of the differential data line 130. In FIG. 1, the differential data transceiver 104 is shown to have this programmable circuitry 120. However, such programmable circuit could additionally or alternatively be implemented with the differential data transceiver 140.

In accordance with at least some embodiments, the programmable circuitry 120 compensates for variations in the series impedance of the differential data line 130 by programming the resistance of single-ended termination resistors ($Z_{TERM}$) 122 for the differential data line 130. Additionally or alternatively, the programmable circuitry 120 compensates for variations in the series impedance by varying a programmable transmitter output current drive. Additionally or alternatively, the programmable circuitry 120 compensates for variations in the series impedance by varying a programmable transient boost current. Additionally or alternatively, the programmable circuitry 120 compensates for variations in the parallel impedance by varying a programmable transient boost current. In accordance with at least some embodiments, the transient boost current opens an eye diagram during data transitions without violating communication protocol requirements for direct current (DC) values. Although FIG. 1 shows the programmable circuitry 120 and termination resistors 122 as being separate from the high-speed transmitter 108 (between the transmitter 108 and the differential data line 130), alternative embodiments may combine these components together. Additional details for the programmable circuitry 120 are provided in FIG. 2.

Figure 2:
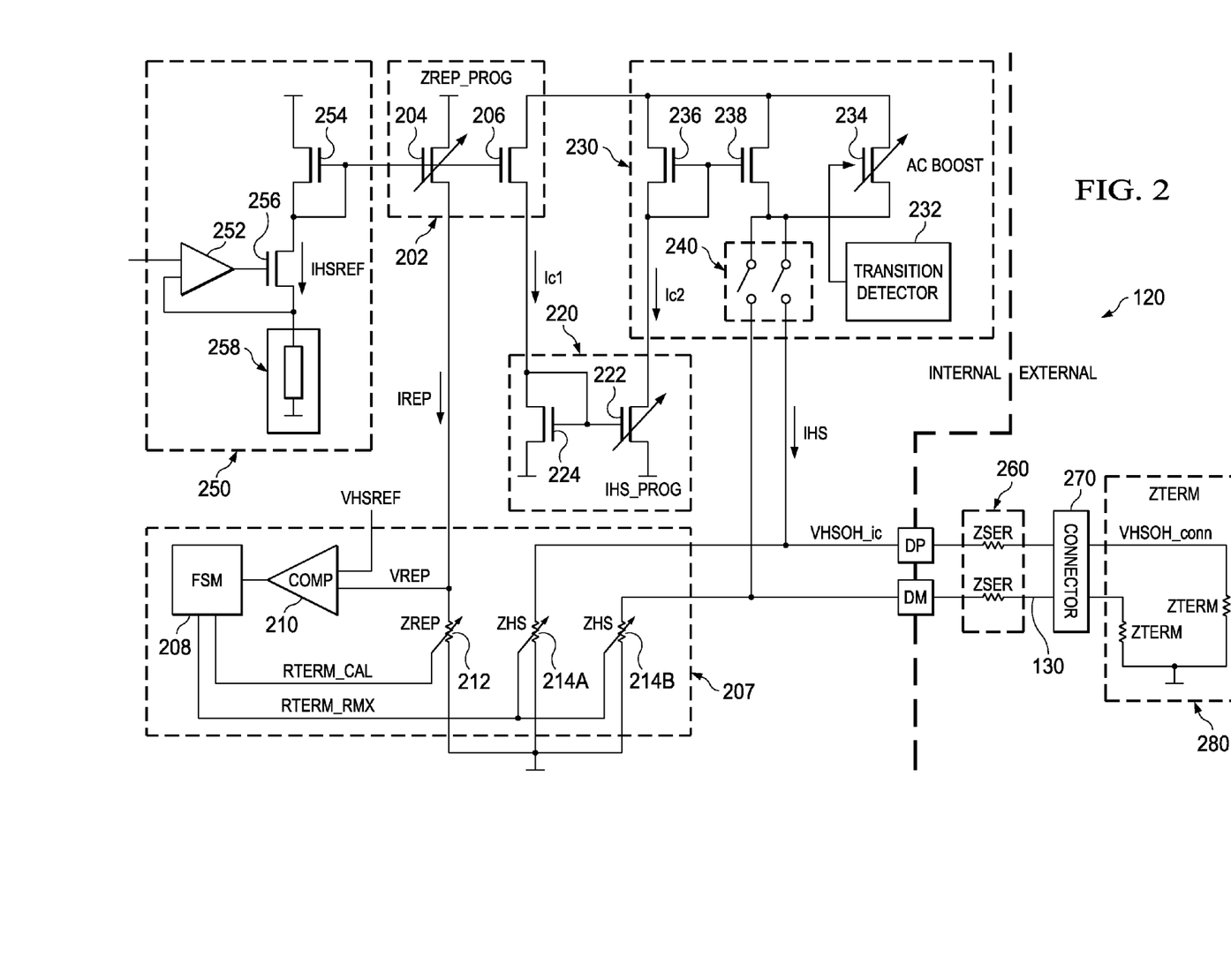
FIG. 2 shows an embodiment of the programmable circuitry described for FIG. 1.

FIG. 2 shows an embodiment of the programmable circuitry or impedance compensation circuitry 120 described for FIG. 1. In the embodiment of FIG. 2, the programmable circuitry 120 generally comprises a first circuitry portion or reference current source 250, a second circuitry portion or programmable current source 202, a third circuitry portion or a control circuit 207, a fourth circuitry portion or a current mirror 220, and a fifth circuitry portion or boost current circuit 230. As will be described in greater detail, the first circuitry portion 250, the second circuitry portion 202, and the third circuitry portion 207 enable termination (ZHS) impedances 214A and 214B to be controlled. Firstly, the first, second and third circuitry portions allow ZHS impedances to be compensated for temperature drift and therefore maintain impedance matching with the external termination impedances ZTERM 280. Secondly, the first, second and third circuitry portions allow ZHS impedances to be programmed to compensate for external series impedances (ZSER) 260 added to the differential data line 130 between the circuitry 120 and the connector 270.

As a first example, the programmable circuitry 120 may be used to calibrate termination (ZHS) impedances 214A and 214B to match with the external termination impedances ZTERM 280 such that ZHS=ZTERM. As a second example, the programmable circuitry 120 may be used to program termination (ZHS) impedances 214A and 214B to compensate for an external series impedances (ZSER) 260 while maintaining matching with the external termination impedances ZTERM 280 at the connector 270 such that ZHS=ZTERM−ZSER.

As shown, the first circuitry portion 250 provides a current source IHSREF which should be first-order temperature independent. One implementation of such a current source is shown in FIG. 2. In this example, a bandgap reference voltage is applied to a resistive element 258 via a feedback loop comprising an amplifier 252 and a transistor 256. The resistive element 258 may take the form of, but is not limited to, an internal resistor, an external resistor, or a switched capacitor resistive element. The second circuitry portion 202 may comprise transistors 204 and 206. The transistor 204 controls a programmable current $I_{REP}$ based on IHSREF and a control signal (ZREP_PROG). The transistor 206 controls a fixed current $I_{C1}$ based on IHSREF. In accordance with at least some embodiments, the transistors 204 represent a current digital-to-analog converter (DAC) (e.g., a 3-bit current DAC) with ZREP_PROG as the control signal. ZREP_PROG control signal is provided externally.

As shown, $I_{REP}$ is provided from the second circuitry portion 202 to the third circuitry portion 207. In accordance with at least some embodiments, the second circuitry portion comprises a finite state machine (FSM) 208 that provides a first control signal ($R_{TERM\_CAL}$) for a variable resistor ($Z_{REP}$) and a second control signal ($R_{TERM\_RMX}$) for the variable ZHS impedances 214A and 214B. The operation of the FSM 208 is controlled in part by the output of a comparator 210 that compares an input signal ($V_{REP}$) with a voltage reference (VHSREF).

In accordance with at least some embodiments, the ZHS impedances 214A, 214B represent a resistive digital-to-analog converter (DAC) or other programmable component with the input control code being provided by the FSM 208. To calibrate the ZHS impedances 214A and 214B, the third circuitry portion 207 is used. A replica ($I_{REP}$) of the temperature independent output drive current (IHS) is applied through a replica ($Z_{REP}$) of the temperature dependent ZHS impedances 214A, 214B. The calibration of $Z_{REP}$ generates a temperature dependent voltage ($V_{REP}$) which is a proportional replica of the high level transmitter output voltage (VHSOH_conn).

VHSOH_ic is the transmitter output voltage of the transceiver 104 at the integrated circuit (IC) pins (pins DP and DM in FIG. 2). VHSOH_ic=IHS*(ZHS//((ZSER+ZTERM))= IHS*(ZHS*(ZSER+ZTERM)/(ZSER+ZHS+ZTERM)), where "//" denotes "in parallel with". VHSOH_conn is the transmitter output voltage of the transceiver 104 measured at the connector 270. Hence VSHOH_conn=VHSOH_ic* (ZTERM/(ZSER+ZTERM))=IHS*ZHS* ZTERM/(ZSER+ ZHS+ZTERM).

As shown ZHS=ZTERM−ZSER is required in order to compensate for an external series impedances (ZSER) 260 while maintaining matching with the external termination impedances ZTERM 280 at the connector 270. Substituting for this ZHS target in the VHSOH_conn equation results in VHSOH_conn=IHS*(ZTERM−ZSER)/2=IHS*ZHS/2.

$V_{REP}$ is compared to a temperature independent voltage reference (VHSREF) by the comparator 210 and the comparator's output is provided as a control signal to the FSM 208. The FSM 208 then outputs a control signal (e.g., a control code) to drive the termination ZHS impedances 214A and 214B up or down.

In FIG. 2, the second circuitry portion 202, the fourth circuitry portion 220, and the fifth circuitry portion 230 combined show that for a given IHS_PROG multiplication factor M (described later), IHS is related to $I_{REP}$ by a fixed current multiplication ratio Ki, where Ki is defined by the equation $I_{REP}$=Ki*IHS. A fixed ratio between $Z_{REP}$ and ZHS is maintained irrespective of the calibrated value of $Z_{REP}$, such that we can define $Z_{REP}$=Kr*ZHS. If a resistive DAC is used for the ZHS impedances 214A and 214B, and for the replica ($Z_{REP}$) impedance 212, the FSM 208 may sweep down a sequence of input codes for the replica resistive DAC $Z_{REP}$ 212 until the comparator 210 toggles from high to low. This sets the value of $Z_{REP}$ 212 and hence ZHS. In accordance with embodiments, the toggling occurs approximately when VHSREF=$V_{REP}$. Since $V_{REP}=I_{REP}*Z_{REP}$; and $I_{REP}=Ki*IHS$; and $Z_{REP}=Kr*ZHS$; and VHSOH_conn=IHS*(ZHS/2)); hence, $V_{REP}=2*Ki*Kr*VHSOH\_conn$. Since Ki and Kr are temperature independent factors and VHSREF is a bandgap voltage and is (to first-order approximation) temperature independent, VHSOH_conn can be made temperature independent. Thus, after calibration we have $V_{REP}$=VHSREF=$I_{REP}*Z_{REP}$. Substituting for $Z_{REP}$=Kr*ZHS and solving for ZHS, we have ZHS=(VHSREF/$I_{REP}$)*(1/Kr). Therefore 3 independent variables are available with which to calibrate and program ZHS. By programming $I_{REP}$, the ZHS impedances 214A and 214B can be made programmable.

In accordance with at least some embodiments, $I_{REP}$ is programmed using an offset current DAC (implemented by the second circuitry portion 202). For example, a DAC of 3-bits may be controlled by a digital signal ZREP_PROG allowing IREP to be independently adjusted by a multiplication factor P. In this case, the equation for ZHS becomes ZHS=(VHSREF/($I_{REP}*P$))*(1/Kr). Using this multiplication factor P, the ZHS impedances 214A, 214B can be reduced to compensate for series impedance on the differential data line 130. If VHSREF, Kr and the default value of $I_{REP}$ are set in order to calibrate for ZHS=ZTERM with multiplication factor P=1 (where P corresponds to a particular value of ZREP_PROG); then P can be programmed to compensate for external series impedances (ZSER) 260 by adjusting the calibration target to ZTERM−ZSER by setting P=ZTERM/(ZTERM−ZSER).

As an example, a system with termination impedances ZTERM 280 may have various external components (e.g., common mode filters), which may be coupled to the differential data line 130 and which present a combined series impedance ZSER 260. ZSER may be compensated by programming $I_{REP}$ in order to have ZHS=ZTERM−ZSER. A ZHS impedance reduction between 0 to N ohms (let N=3 in this example) may be sufficient to compensate for various external components (e.g., common mode filters). More specifically, if an external component adds approximately 0 ohms to the series impedance of the differential data line 130 which is terminated with termination impedances ZTERM 280 of 45 ohms, $I_{REP}$ is programmed so that each ZHS impedance 214A, 214B has a value of approximately 45 ohms. If an external component (or components) adds approximately 1 ohm to the series impedance of the differential data line 130, $I_{REP}$ is programmed so that each ZHS impedance 214A, 214B has a value of approximately 44 ohms. If an external component (or components) adds approximately 2 ohms to the series impedance of the differential data line 130, $I_{REP}$ is programmed so that each ZHS impedance 214A, 214B has a value of approximately 43 ohms. If an external component (or components) adds approximately 3 ohms to the series impedance of the differential data line 130, $I_{REP}$ is programmed so that each ZHS impedance 214A, 214B has a value of approximately 42 ohms.

When an external component (or components) is added to the differential data line 130, the high-level voltage at the transceiver 104 (VHSOH_ic) is not the same as the high-level voltage at connector 270 (VHSOH_conn) because VHSOH_conn is degraded by the serial impedance ZSER 260 on the differential data line 130. This may immediately be seen from the equation for VSHOH_conn described previously by setting ZHS=ZTERM−ZSER. The result is VHSOH_conn=IHS*(ZTERM−ZSER)/2, which is less than the target value of VHSOH=VHSOH_ic=VHSOH_conn=IHS*ZTERM/2 for matched line with ZSER=0 and ZHS=ZTERM. This degradation in VHSOH_conn may be compensated for by multiplying by an independent variable M such that VHSOH_conn=M*IHS*(ZTERM−ZSER)/2. For the case of no external series impedance present (i.e., ZSER=0), setting M=1 will make VHSOH_conn=IHS*ZTERM/2. For the case of an external series impedance ZSER present, setting M=(ZTERM/(ZTERM−ZSER)) will make VHSOH_conn=IHS*ZTERM/2.

In accordance with at least some embodiments, the fourth circuitry portion 220 is configured to adjust IHS by a multiplication factor M. As shown, the fourth circuitry portion 220 comprises transistors 222 and 224, which may represent an offset current DAC (e.g., a 4-bit DAC) or another programmable component controlled by a digital control signal IHS_PROG in order to set the IHS multiplication factor M. The IHS_PROG control signal may be provided externally. Increasing and decreasing IHS has a direct effect on the VHSOH_conn values. In other words, increasing IHS causes VHSOH_conn to increase. Alternatively, decreasing IHS causes VHSOH_conn to decrease. In accordance with at least some embodiments, the IHS values and the ZHS impedance values are controlled together. As previously discussed, the ZHS impedances 214A, 214B are programmable by controlling $I_{REP}$ (e.g., using the first circuitry portion 250, the second circuitry portion 202, and the third circuitry portion 207) and VHSOH is programmable by controlling IHS (e.g., using the fourth circuitry portion 220). As previously discussed, in some embodiments, $I_{REP}$ and IHS may be controlled using current DACs.

As an example Table 1A shows various parameter values and illustrates how VHSOH_conn values are affected by ZSER 260; Table 1B shows various parameter values and illustrates how VHSOH_conn values are affected by adjusting the ZHS impedances 214A, 214B to compensate for ZSER 260; and Table 1C shows various parameter values and illustrates how VHSOH_conn values are affected by adjusting the ZHS impedances 214A, 214B and a transmitter output current drive (IHS) multiplication factor M to compensate for ZSER 260. In Tables 1A-1C, it is assumed that the desired voltage level for VHSOH_conn is 400.0 mV with termination impedances ZTERM 280 of 45 ohms. For example, a particular communication protocol (e.g., USB 2.0) may specify that voltage levels for differential data communications be at 400 mV+/−10% (360 mV to 440 mV).

TABLE 1A

| ZSER (ohm) | 0 | 1 | 2 | 3 |
|---|---|---|---|---|
| IHS (mA) | 17.78 | 17.78 | 17.78 | 17.78 |
| M | 1.000 | 1.000 | 1.000 | 1.000 |
| ZHS (ohm) | 45 | 45 | 45 | 45 |
| ZTERM (ohm) | 45 | 45 | 45 | 45 |
| VHSOH_ic (mV) | 400.0 | 404.4 | 408.7 | 412.9 |
| VHSOH_conn (mV) | 400.0 | 395.6 | 391.3 | 387.1 |

TABLE 1B

| ZSER (ohm) | 0 | 1 | 2 | 3 |
|---|---|---|---|---|
| IHS (mA) | 17.78 | 17.78 | 17.78 | 17.78 |
| M | 1.000 | 1.000 | 1.000 | 1.000 |
| ZHS (ohm) | 45 | 44 | 43 | 42 |
| ZTERM (ohm) | 45 | 45 | 45 | 45 |
| VHSOH_ic (mV) | 400.0 | 400.0 | 400.0 | 400.0 |
| VHSOH_conn (mV) | 400.0 | 391.3 | 383.0 | 375.0 |

TABLE 1C

| ZSER (ohm)    | 0     | 1     | 2     | 3     |
|---------------|-------|-------|-------|-------|
| IHS (mA)      | 17.78 | 18.17 | 18.57 | 18.96 |
| M             | 1.000 | 1.022 | 1.044 | 1.066 |
| ZHS (ohm)     | 45    | 44    | 43    | 42    |
| ZTERM (ohm)   | 45    | 45    | 45    | 45    |
| VHSOH_ic (mV) | 400.0 | 408.9 | 417.8 | 426.7 |
| VHSOH_conn (mV)| 400.0| 400.0 | 400.0 | 400.0 |

As shown in the example of Table 1A, VHSOH_conn decreases as ZSER 260 increases. More specifically, if ZSER is approximately 0 ohms, VHSOH_conn is approximately 400.0 mV. If ZSER is approximately 1 ohm, VHSOH_conn is approximately 395.6 mV. If ZSER is approximately 2 ohms, VHSOH_conn is approximately 391.3 mV. If ZSER is approximately 3 ohms, VHSOH_conn is approximately 387.1 mV. In comparison, VHSOH_ic increases from 400.0 mV to 412.9 mV as ZSER increases from 0 ohms to 3 ohms. Various other parameters shown for FIG. 2 maintain their respective values as ZSER changes, with IHS at 17.78 mA, M at 1, ZHS at 45 ohms, and ZTERM at 45 ohms.

As shown in the example of Table 1B, adjusting the ZHS impedances 214A, 214B to compensate for ZSER 260 sets VHSOH_ic at a desired value (e.g., 400.0 mV), but causes an additional decrease in VHSOH_conn values. More specifically, if ZSER is approximately 0 ohms, ZHS is approximately 45 ohms and VHSOH_conn is approximately 400.0 mV. If ZSER is approximately 1 ohm, ZHS is reduced to approximately 44 ohms and VHSOH_conn is approximately 391.3 mV. If ZSER is approximately 2 ohm, ZHS is reduced to approximately 43 ohms and VHSOH_conn is approximately 383.0 mV. If ZSER is approximately 3 ohm, ZHS is reduced to approximately 42 ohms and VHSOH_conn is approximately 375.0 mV. Various other parameters shown for FIG. 2 maintain their respective values as ZSER changes, with IHS at 17.78 mA, M at 1, and ZTERM at 45 ohms.

As shown in the example of Table 1C, adjusting the ZHS impedances 214A, 214B and IHS multiplication factor M together to compensate for ZSER 260 increases VHSOH_conn values (to be nearer a desired value such as 400.0 mV) compared to adjusting only ZHS impedances 214A, 214B as in Table 1B. More specifically, if ZSER is approximately 0 ohms, ZHS is approximately 45 ohms, IHS is approximately 17.78 mA, M is approximately 1, VHSOH_ic is approximately 400.0 mV, and VHSOH_conn is approximately 400.0 mV. If ZSER is approximately 1 ohm, ZHS is adjusted to approximately 44 ohms, IHS is adjusted to approximately 18.17 mA with M approximately 1.022, VHSOH_ic is adjusted to approximately 408.9 mV, and VHSOH_conn is approximately 400.0 mV. If ZSER is approximately 2 ohms, ZHS is adjusted to approximately 43 ohms, IHS is adjusted to approximately 18.57 mA with M approximately 1.044, VHSOH_ic is adjusted to approximately 417.8 mV, and VHSOH_conn is approximately 400.0 mV. If ZSER is approximately 3 ohms, ZHS is adjusted to approximately 42 ohms, IHS is adjusted to approximately 18.96 mA with M approximately 1.066, VHSOH_ic is adjusted to approximately 426.7 mV, and VHSOH_conn is approximately 400.0 mV. Other parameters shown for FIG. 2 maintain their respective values as ZSER, IHS, and M change, with ZTERM at 45 ohms.

In accordance with at least some embodiments, a transient boost current may also be added to IHS. In FIG. 2, the transient boost current is controlled by the fifth circuitry portion 230, which selectively provides the boost current during voltage transitions (from low-to-high or from high-to-low). As shown, the fifth circuitry portion 230 comprises a current minor (which generally comprises transistors 236 and 238), a boost transistor 234, a transition detector 232, and a switch network 240. The current minor (which generally comprises transistors 236 and 238) mirrors a current Ic2 controlled by the fourth circuitry portion 220 to provide the transmitter output drive current IHS and to selectively boost IHS (e.g., during transitions), and the transistor 234 acts as an auxiliary transmitter to selectively boost IHS based on a control signal from transition detector 232. The current mirror (i.e., transistors 236 and 238) and boost transistor 234 can be coupled to the differential terminals DP and DM through the switch network 240 when a voltage transition is detected by the transition detector 232. As an example, the boost may add approximately 10% of extra current to IHS. In accordance with at least some embodiments, the transition detector 232 is reset after the output data is stable for a predetermined number of consecutive periods (e.g., 2.5 periods) and the current boost stops at least until a subsequent transition is detected.

Figure 3:
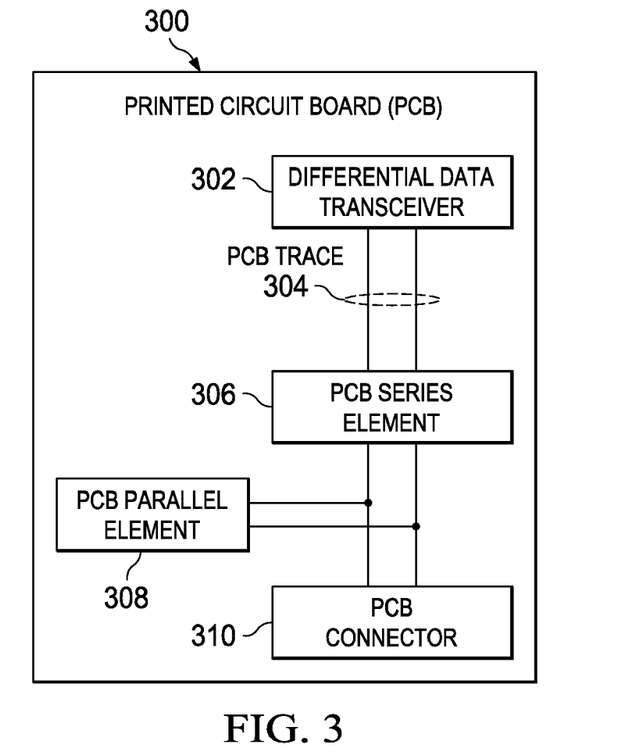
FIG. 3 shows a printed circuit board of an electronic device in accordance with an embodiment of the disclosure.

FIG. 3 shows a printed circuit board (PCB) 300 of an electronic device (e.g., device 102) in accordance with an embodiment of the disclosure. In FIG. 3, the PCB 300 comprises a differential data transceiver 302 mounted on the PCB 300, the differential data transceiver 302 represents the transceiver 104 of FIG. 1 or another transceiver that implements the programmable circuitry 120 previously discussed. As shown, the PCB 300 comprises various components external to the transceiver 302, including a PCB trace 304, a PCB series element 306 (i.e., the PCB series element 306 is in series with the PCB trace 304 which forms part of a differential data line), a PCB parallel element 308 (i.e., the PCB parallel element 308 is in parallel with the PCB trace 304 which forms part of a differential data line), and a PCB connector 310. The PCB series element 306 may represent, for example, a common mode filter. The PCB parallel element 308 may represent, for example, an electrostatic discharge (ESD) protection element. The PCB connector 310 is compatible, for example, with USB 2.0 protocol or another communication protocol. The PCB trace 304, the PCB series element 306, and the PCB connector 310 may add series impedance to the differential data line associated with the transceiver 302. To compensate for such series impedance on the differential data line, the programmable circuitry 120 of transceiver 302 is configured to adjust ZHS, the transmitter output drive current IHS and/or the transient current boost as previously discussed. To compensate for parallel impedance on the differential line, which may cause transient reflections on the line due to discontinuities in line impedance matching, or other transient reflections, the transmitter output drive current IHS and/or the transient current boost as may be used.

Figure 4:
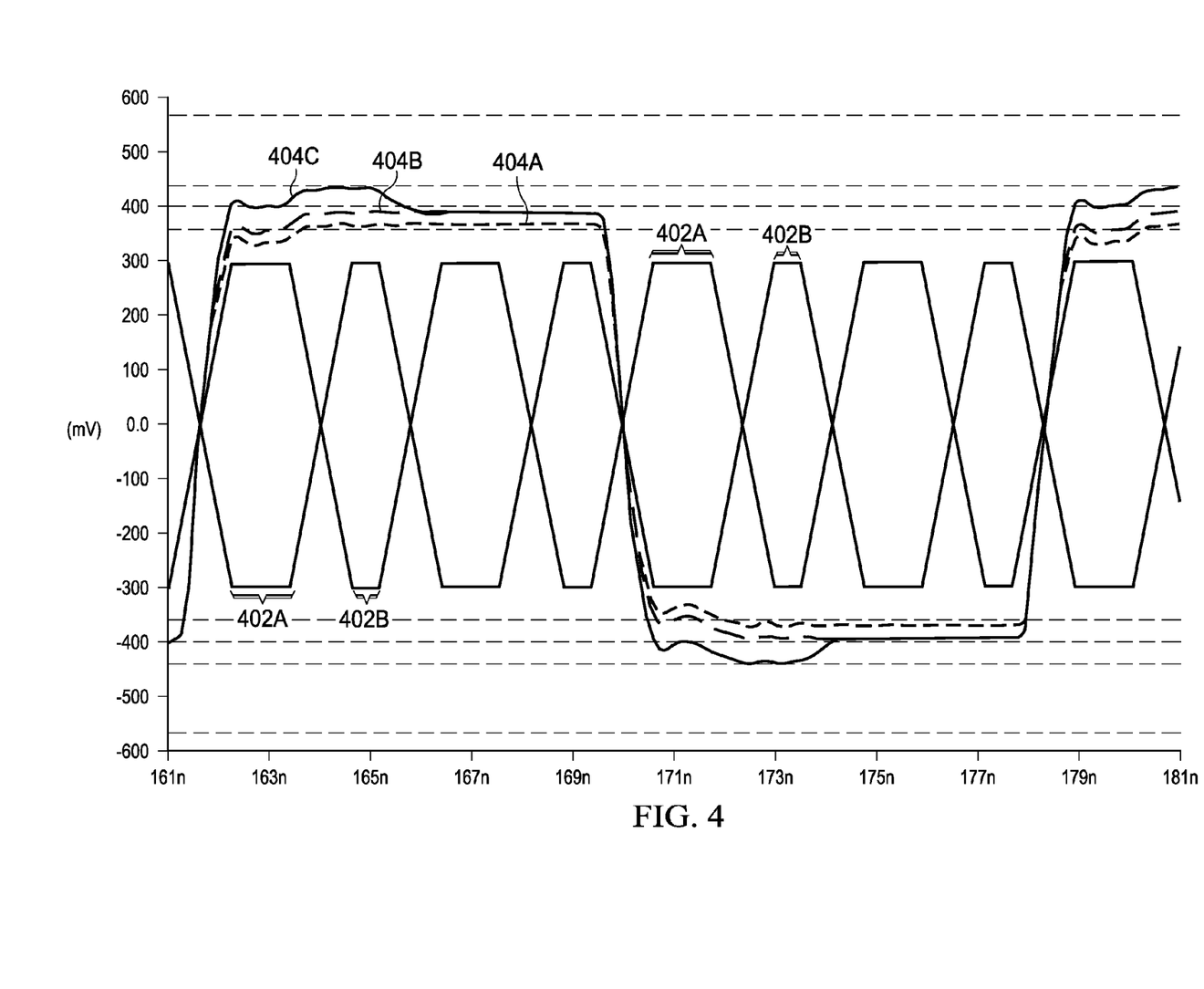
FIG. 4 illustrates waveform variations output by a differential data transmitter in accordance with an embodiment of the disclosure.

FIG. 4 illustrates waveform variations 404A, 404B, 404C output by a differential data transmitter (e.g., transmitter 104) in accordance with an embodiment of the disclosure. In FIG. 4, it is assumed that the ZHS impedances 214A, 214B have been reduced, if necessary, to compensate for serial impedance on the differential data line. Further, it is assumed that to comply with a communication protocol, the transmitter should output differential data DC voltage levels of 400 mV+/−10% (360 mV to 440 mV).

In FIG. 4, the waveform 404A represents the output of a differential data transmitter without current drive compensation (IHS adjustment). During transitions (from low-to-high or from high-to-low), the waveform 404A does not adequately reach +/−360 mV until some time into a first post-transition period 402A. The waveform 404B represents the output of a differential data transmitter with current drive compensation (IHS adjustment). During transitions, the waveform 404B adequately reaches +/−360 mV before the first post-transition period 402A but then falls below 360 mV during the first post-transition period 402A due to transient reflections on the differential data line. The waveform 404C represents the output of a differential data transmitter with current drive compensation (IHS adjustment) and current boost. During transitions, the waveform 404D adequately reaches +/−360 mV before the first post-transition period 402A and maintains a value between 360 mV and 440 mV as is desired for the embodiment shown. After the first post-transition period 402A and a second post-transition period 402B, the current boost is turned off with the waveform maintaining a stable value at around +/−400 mV. Although FIG. 4 illustrates that current drive compensation and current boost compensation may be beneficial to meet a given communication protocol requirement, different embodiments may differ with regard to the amount or use of ZHS impedance adjustment, current drive adjustment, and current boost adjustment.

Figure 5:
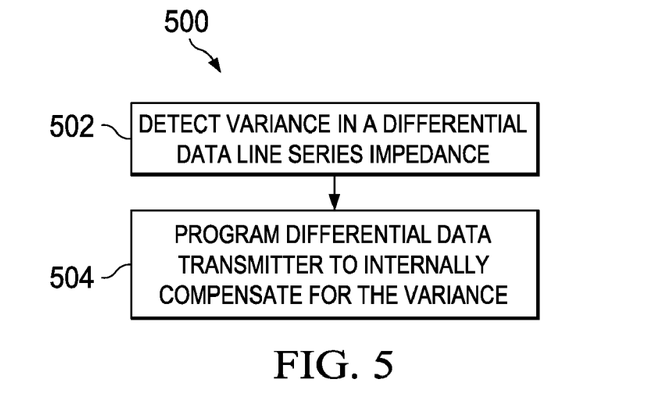
FIG. 5 shows a method in accordance with an embodiment of the disclosure.

FIG. 5 shows a method 500 in accordance with an embodiment of the disclosure. In accordance with embodiments, the method 500 is performed for a differential data transmitter. In FIG. 5, the method 500 comprises detecting a variance (from a desired value) in a differential data line series impedance (block 502). The detection process may be based on electrical tests and/or physical inspection of PCB components or component specifications. At block 504, the method 500 comprises programming the differential data transmitter to internally compensate for the detected variance.

In at least some embodiments, internally compensating for the variance (as in block 504) comprises adjusting a single-ended termination resistance (ZHS). For example, in some embodiments, the single-ended termination resistance is adjusting by providing a multi-bit control signal to a resistive digital-to-analog converter (DAC). Additionally, internally compensating for the variance (as in block 504) may comprise adjusting a transmitter output current drive. For example, in some embodiments, changing the transmitter output current drive comprises providing a multi-bit control signal to a current digital-to-analog converter (DAC). Additionally, internally compensating for the variance (as in block 504) may comprise detecting a data transition and activating a transient boost current.

In accordance with embodiments, the method 500 is performed when a chip having the differential data transmitter is incorporated into a product design. Thus, a single differential data transmitter design (embodied in the chip) is compatible with many product designs, even if the product design couples different components to the differential data line or otherwise causes variance to the differential data line series impedance.

The above discussion is meant to be illustrative of the principles and various embodiments of the present invention. Numerous other variations and modifications will become apparent to those skilled in the art once the above disclosure is fully appreciated. It is intended that the following claims be interpreted to embrace all such variations and modifications.

What is claimed is:

1. An apparatus comprising:
   a first data endpoint; and
   differential data transceiver coupled to the first data endpoint, the differential transceiver providing a communication interface between the first data endpoint and a second data endpoint, wherein the differential data transceiver internally compensates for variations in a series impedance for a differential data line between the differential transceiver and the second data endpoint based at least on part on a programmable transient boost current, wherein the programmable transient boost current opens an eye diagram during data transitions without affecting a direct current (DC) value for the data transitions.

2. The apparatus of claim 1, wherein the differential data transceiver internally compensates for variations in the series impedance based on a programmable single-ended termination resistance.

3. The apparatus of claim 1, wherein the differential data transceiver internally compensates for variations in the series impedance based on a programmable transmitter output current drive.

4. The apparatus of claim 1, wherein the apparatus further comprises a printed circuit board (PCB) upon which the differential data transceiver is mounted, wherein variations in the series impedance for the differential data line are due to at least one component associated with the PCB.

5. The apparatus of claim 4, wherein the at least one component further comprises a component selected from the list consisting of a PCB trace, a PCB component mounted in series with the differential data line, a PCB component mounted in parallel with the differential data line, PCB connector for the second data endnode.

6. An apparatus comprising:
   a differential data line port;
   programmable circuitry coupled to the differential data line port, wherein the programmable circuitry internally compensates for external variances in a differential data line series impedance; and
   a transition detector coupled to a transient current booster that selectively increases an output current for the different data line.

7. The apparatus of claim 6, wherein the programmable circuitry comprises a resistive digital-to-analog converter (DAC) that selectively offsets a termination impedance of the differential data line.

8. The apparatus of claim 6, wherein the programmable circuitry compensates for external variances in a differential data line parallel impedance using at least one of a transient current boost and a programmable transmitter output current drive.

9. The apparatus of claim 6, wherein the programmable circuitry comprises a current DAC that selectively offsets a transmitter output current drive.

10. The apparatus of claim 6, wherein the transient current booster is limited to avoid surpassing a direct current (DC) value for the data transitions and wherein the transition detector is reset when output data is stable for a predetermined number of clock periods.

11. A method comprising:
   detecting a variance in a differential data line series impedance or a differential data line parallel impedance; and
   programming the differential data transmitter to internally compensate for the variance by configuring data transition circuitry to activate and de-activate a transient boost current.

12. The method of claim 11, wherein the step of programming the differential data transmitter to internally compensate variance in the differential data line series impedance further comprises adjusting a single-ended termination resistance.

13. The method of claim 12, wherein the step of adjusting the single-ended termination resistance further comprises providing a multi-bit control signal to a resistive DAC.

14. The method of claim 11, wherein the step of programming the differential data transmitter to internally compensate for the variance further comprises adjusting a transmitter output current drive.

15. The method of claim 14 wherein adjusting the transmitter output current drive comprises providing a multi-bit control signal to a current digital-to-analog converter (DAC).

16. An apparatus comprising:
   a pair of differential terminals;
   a receiver that is coupled to the pair of differential terminals;
   a transmitter that is coupled to the pair of differential terminals;
   impedance compensation circuitry including:
      a control circuit that is coupled to the pair of differential terminals so as to provide a temperature dependant termination impedance; and
      a boost current circuit that is coupled to the pair of differential terminals so as to provide a boost current during voltage transitions.

17. The apparatus of claim 16, wherein the impedance compensation circuitry further comprises:
   a reference current source;
   a programmable current source that is coupled to the reference current source and the control circuit, wherein the programmable current source provides a first current to the control circuit, and wherein the first current is temperature dependant; and
   a current minor that is coupled to the programmable current source and the boost circuit, wherein the current mirror receives a second current from the programmable current source.

18. The apparatus of claim 17, wherein the current minor further comprises a first current minor, and wherein the boost current circuit further comprises:
   a second current mirror that is coupled to the first current mirror;
   a transition detector;
   a boost transistor that is controlled by the transition detector; and
   a switch network that is coupled to the boost transistor, the second current minor, and the pair of differential terminals, wherein the switch network couples the boost transistor and the second current mirror to the pair of differential terminals during the voltage transitions.

19. The apparatus of claim 17, wherein the control circuit further comprises:
   a state machine;
   a variable impedance network that is coupled to the programmable current source so as to receive the first current, that is coupled to the pair of differential terminals, and that is controlled by the state machine; and
   a comparator that is coupled to the variable impedance and the state machine.

20. The apparatus of claim 19, wherein the variable impedance network further comprises a DAC.

* * * * *